United States Patent [19]

Tanaka et al.

[11] Patent Number: 4,533,837
[45] Date of Patent: Aug. 6, 1985

[54] KEYBOARD-EQUIPPED APPARATUS SUCH AS AN ELECTRONIC CALCULATOR WITH BATTERY THROW MEANS FOR ENABLING A POWER SUPPLY CIRCUIT

[75] Inventors: Shinichi Tanaka, Nara; Takitsugu Mineyama, Uda, both of Japan

[73] Assignee: Sharp Kabushiki Kaisha, Osaka, Japan

[21] Appl. No.: 614,702

[22] Filed: May 29, 1984

Related U.S. Application Data

[63] Continuation of Ser. No. 438,331, Nov. 1, 1982, abandoned, which is a continuation of Ser. No. 891,640, Mar. 30, 1978, abandoned.

[30] Foreign Application Priority Data

Mar. 31, 1977 [JP] Japan ................... 52-37078

[51] Int. Cl.³ ................... H01H 3/00; H03K 17/22
[52] U.S. Cl. ................... 307/116; 307/126; 307/140; 307/594; 307/585
[58] Field of Search ............. 307/116, 126, 150, 297, 307/362, 363, 585, 594, 597; 340/365 C, 636, 654; 235/201; 368/204

[56] References Cited

U.S. PATENT DOCUMENTS

| | | | |
|---|---|---|---|
| 3,760,192 | 9/1973 | Darrow | 307/363 |
| 4,024,415 | 5/1977 | Matsuura | 307/362 |
| 4,029,996 | 6/1977 | Miffitt | 307/116 X |
| 4,119,864 | 10/1978 | Petrizio | 307/116 |
| 4,140,930 | 2/1979 | Tanaka | 307/585 X |
| 4,257,117 | 3/1981 | Besson | 340/365 C |
| 4,322,631 | 3/1982 | Spofford | 307/116 |

Primary Examiner—A. D. Pellinen
Assistant Examiner—Derek S. Jennings
Attorney, Agent, or Firm—Birch, Stewart, Kolasch & Birch

[57] ABSTRACT

A power throw circuit is provided within a keyboard-equipped apparatus such as an electronic calculator, an electronic timepiece etc. for determining whether a battery or batteries are connected between supply terminals therefor, whereby a power supply controller is not enabled to disconnect said power supply unless a power throw detection signal is developed from the power throw circuit. In response to the occurrence of the power throw detection signal from the power throw circuit power energy is automatically supplied from the power source to a power utilization circuit. In a preferred form, once the power utilization circuit has been enabled, and placed into the stable condition, the power throw detection circuit will no longer have any influence on the utilization circuit. In such stable conditions, the subsequent actuations of any key of a keyboard can control the power supply from the power source to the power utilization circuit. In another preferred form, the power throw circuit continuously provides the supply of power from the power source to the power utilization circuit without regard to the actuation of any key on the keyboard.

3 Claims, 3 Drawing Figures

POWER THROW CIRCUIT

POWER UTILIZATION CIRCUIT

POWER THROW CIRCUIT    POWER UTILIZATION CIRCUIT

KEYBOARD-EQUIPPED APPARATUS SUCH AS AN ELECTRONIC CALCULATOR WITH BATTERY THROW MEANS FOR ENABLING A POWER SUPPLY CIRCUIT

This application is a continuation of application Ser. No. 438,331 filed on Nov. 1, 1982 and now abandoned which is a continuation of application Ser. No. 891,640 filed on Mar. 30, 1978 and also abandoned.

BACKGROUND OF THE INVENTION

The present invention relates to a power throw means and, more particularly, to a power throw means for enabling a power supply controller useful for electronic apparatuses such as electronic calculators and electronic timepieces etc.

Prior art power supply controllers employed within various electronic apparatus comprise a low power consumption circuit such as a flip-flop circuit to minimize power dissipation. The flip-flop circuit permits the power supply controller to operate so as to control power energy from a power source to a power utilization circuit. In these power supply controllers, the condition of the flip-flop circuit may change causing disorder within the power utilization circuit when a new power source is supplied in lieu of the old one.

Therefore, it is very desirable that a power throw means be provided within the power supply controller for enabling the power supply controller in response to the application of power derived from the power source.

OBJECTS AND SUMMARY OF THE INVENTION

With the foregoing in mind, it is a primary object of the present invention to provide a novel power supply controller initially operated in response to the application of power from an available power source.

It is another object of the present invention to provide a power throw means for enabling a power supply circuit in response to the power derived from the application of power source.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, a power throw circuit is provided within a keyboard-equipped apparatus such as an electronic calculator, an electronic timepiece etc. for determining whether a battery or batteries have been recently connected between the power supply terminals thereof, whereby a power supply controller is enabled when a power throw detection signal is developed from the power throw circuit. In response to the power throw detection signal, power energy is automatically supplied from the power source to a power utilization circuit.

The power utilization circuit may comprise a central processing unit for manipulating induced numerical information in accordance with command information derived from the actuation of any key on a keyboard. It may also comprise a display such as a liquid crystal display.

In a preferred form, once the power utilization circuit has been enabled and placed into the stable condition, the power throw detection circuit will no longer have an influence upon the utilization circuit. In such stable conditions, the subsequent actuations of any key on a keyboard can control the power supply from the power source to the power utilization circuit.

A specific example of the power throw circuit comprises both an MOS transistor and a condenser.

In another preferred form, the power throw circuit continuously enables the power utilization circuit with regard to the continuation of the application of power from the power source. Such a specific circuit of the power throw circuit comprises two MOS transistors connected to resistors, respectively.

BRIEF DESCRIPTION OF THE DRAWINGS

Other objects and novel features of the present invention are set forth in the appended claims and the present invention as to its organization and its mode of operation will best be understood from a consideration of the following detailed description of the preferred embodiments taken in connection with the accompanying drawings, wherein:

DETAILED DESCRIPTION OF THE PREFERRED EMBODIMENTS

Figure 1:
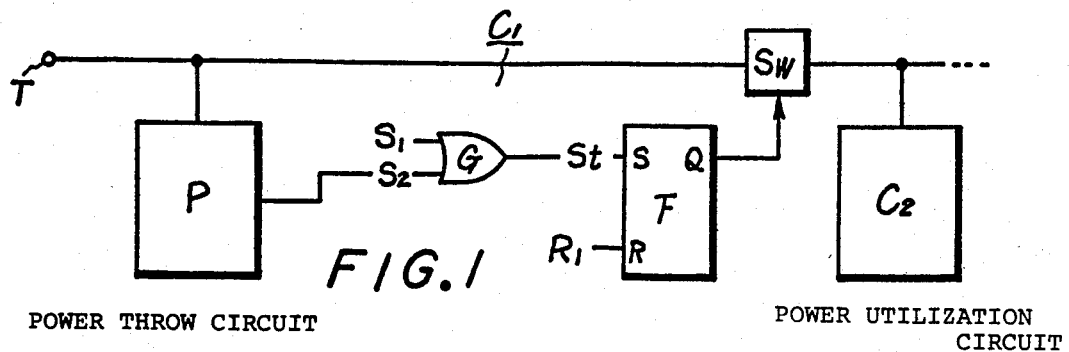
FIGS. 1 and 2 are circuit diagrams of an embodiment of a power supply controller including a power throw circuit of the present invention.

FIG. 1 illustrates a power supply controller C1 including a power throw circuit of the present invention, within a keyboard-equipped apparatus such as a calculator or an electronic timepiece etc, wherein there is provided a power supply terminal T connected to a power source, for example, a battery for transmitting power energy together with the other grounded terminal (not shown) and, there is also provided a power throw circuit P for sensing the application of power from the power source to the power supply terminal T.

A flip-flop circuit F is provided for controlling the supply of the power energy. An OR gate circuit G is provided for providing an output thereof which is applied to a flip-flop circuit F as the set input, the OR gate circuit G receiving both a key signal S1 in response to to the actuation of a key included within a keyboard (not shown), and the output signal S2 developed from the power throw circuit P. The power supply controller C1 is assumed to be operated on a negative voltage derived from the power source throughout the detailed description described below. A switching circuit SW is controlled by the output signal of the flip-flop circuit F. A power utilization circuit is referred to as C2, the power utilization circuit C2 being controlled by the switching circuit SW and comprising a central processing unit and/or a display such as a liquid crystal display etc.

Figure 2:
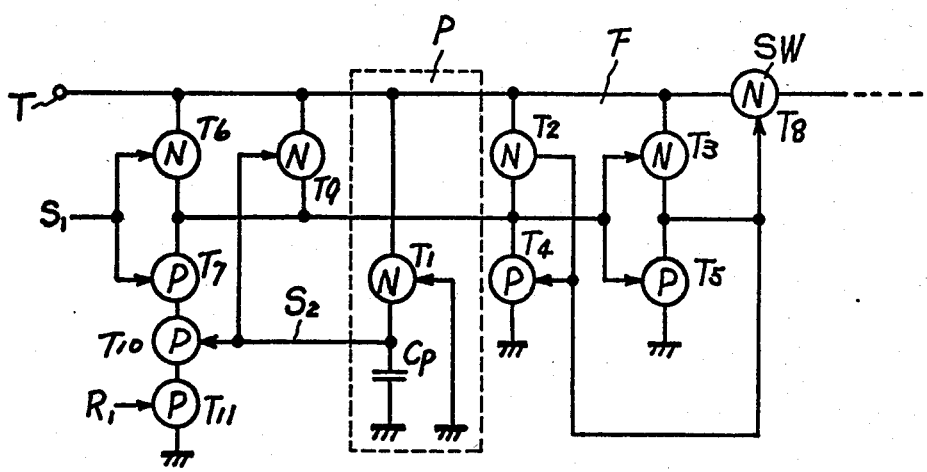

FIG. 2 shows a more specific circuit configuration of the power supply controller C1 shown in FIG. 1, wherein the power throw circuit P comprises an N-channel MOS transistor T1 connected in series to a condenser CP, the N-channel MOS transistor T1 having the gate thereof connected to the ground to function as a resistor means. The voltage potential of the condenser CP equals that of the power source after the power source is applied to the power supply terminal T and the grounded terminal for some time, whereby the output signal S2 of the power throw circuit P is set to the low level thereof.

Therefore, after the power source has been connected for some time, the flip-flop circuit F is controlled and may be set by the key signal S1 developed in accordance with the activation of any key on the keyboard. That is, the set state of the flip-flop circuit F allows the switching circuit SW to turn ON to provide the power supply from the power source to the power utilization circuit C2. Simultaneously with the supply of power by the power supply, to the power utilization circuit C2 the power utilization circuit C2 is placed in initial conditions thereof by a voltage detection means therein for operating in its designed manner. An example of such voltage detection means was disclosed in U.S. Pat. No. 4,140,930 by S. Tanaka entitled "VOLTAGE DETECTION CIRCUIT COMPOSED OF AT LEAST TWO MOS TRANSISTORS", issued on Feb. 20, 1979.

Still referring to FIG. 2, the flip-flop circuit F comprises two N-channel MOS transistors T2, T3 and two P-channel MOS transistors T4, T5. The key signal S1 is introduced into both an N-channel MOS transistor T6 and a P-channel MOS transistor T7 to provide the output signal thereof applied to the flip-flop circuit F. Another N-channel MOS transistor T8 is comprised in the switching circuit SW shown in FIG. 1.

When a new power source is placed between the power supply terminal T and the grounded terminal, the voltage potential of the condenser CP is charged to the power voltage of the power source in accordance with the time constant of an RC integrating circuit comprising the N-channel MOS transistor T1 and the condenser CP. In this transition period, the output signal S2 of the power throw circuit P bears the high level to set another N-channel MOS transistor T9 to the ON state. The N-channel MOS transistor T9 is connected in parallel to another N-channel MOS transistor T6 which has the key signal S1 applied to the gate thereof. When the N-channel MOS transistor T9 is turned ON, the flip-flop circuit F is set simultaneously with the inphut of the key signal S1.

The N-channel MOS transistors T6, T9 and other P-channel MOS transistors T7, T10 are coupled for controlling the drain of the N-channel MOS transistors T6, T9 to the low level thereof at both the application and the transit time of the key signal S1.

As is apparent from the above description according to the features of the present invention, the power throw circuit P can sense the application of the power energy of the power source disposed between the power supply terminal T and the grounded terminal, whereby the flip-flop circuit F is set to provide power to the power utilization circuit C2 during an initial power connection period. In other words, the flip-flop circuit F is uniformly set upon the application of power from the power source to transmit power energy to the power utilizaton circuit C2 in order to energize the power utilization circuit C2 to its initial conditions thereof.

The flip-flop circuit F is reset by a reset signal R1 developed from a timer means in response to the absence of the actuation of any key during a predetermined time and providing the reset signal R1 in response thereto, although the timer means is not shown in the drawings for convenience sake only as it is well known to those skilled in the art. In FIG. 2, another P-channel MOS transistor T11 is connected to ground in series with the P-channel MOS transistors T7 and T10. The flip-flop circuit F is reset in accordance with the ON states of the P-channel MOS transistors T7, T10, and T11 upon the application of the reset signal R1 into the P-channel MOS transistor T11. By the way, the reset signal R1 may be developed in response to the energization of a predetermined key without the timer means in one embodiment of the present invention.

In accordance with the principles of the present invention, when the power source is exchanged or replaced, that is, the application of the power energy of the power source being between the power terminal T and the grounded terminal, the power utilization circuit C2 automatically has the power energy needed to place the power utilization circuit in its initial conditions thereof for operating its subsequent functions. When the display is included within the power utilization circuit C2, the display can indicate whether or not the power energy provided by the power source is complete or sufficient for driving the apparatus therefor.

When no key is operated after the application of the power energy to the power utilization circuit C2 or when the lapse of a predetermined time has occurred without the actuation of any key on the keyboard, the flip-flop circuit F is reset to thereby terminate the power supply to the power utilization circuit C2. The generation of the key signal S1 in response to the actuation of any key on the keyboard permits the power supply to the power utilization circuit C2 to be maintained.

In the above embodiment shown in FIG. 2, it will be observed that since the power throw circuit P includes the RC integrating circuit comprising the N-channel MOS transistor T1 and the condenser CP, the power throw circuit P having a predetermined time constant can not be as responsive to the application of power from the power source when there is a very long transient time before the voltage supply becomes constant, the transient time being dependent on an internal impedance inherent in the power source and the resistance value of the power utilization circuit C2. On the other hand, even if the transient time of the power source is very short, the power throw circuit P continues to operate until the condenser CP has been charged.

Figure 3:
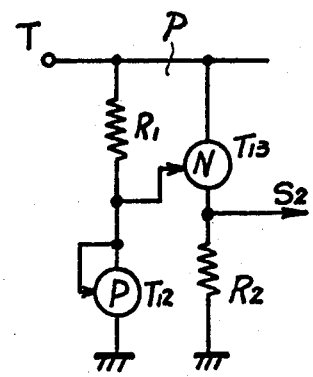
FIG. 3 is a partial circuit diagram of another embodiment of the power throw circuit of the present invention.

Another embodiment of the present invention shown in FIG. 3 is proposed to solve these problems.

FIG. 3 illustrates another circuit configuration of the power throw circuit P, wherein there is provided a P-channel MOS transistor T12 connected to a resistor R1 and an N-channel MOS transistor T13 coupled to the another resistor R2. In FIG. 3, when the potential supplied from the power source into the power supply terminal T is lower than the threshold voltage of the P-channel MOS transistor T12, the P-channel MOS transistor T12 remains OFF. Therefore, the gate voltage of the N-channel MOS transistor T13 equals the power voltage through the resistor R1. Then the N-channel MOS transistor T13 remains OFF because of the power voltage of the source thereof.

When the potential developed from the power source is beyond the threshold voltage of the P-channel MOS transistor T12, the P-channel MOS transistor T12 turns ON to thereby change the gate voltage of the N-channel MOS transistor T13 with respect to the source thereof. The gate voltage of the N-channel MOS transistor T13 is approximately constant while the potential of the power source is beyond the threshold voltage of the P-channel MOS transistor T12. The difference of the potentials between the gate and the source of the N-channel MOS transistor T13 becomes large when the potential of the power source increases. The N-channel MOS transistor T13 remains OFF while the potential difference is below the threshold voltage of the N-channel MOS transistor T13. However, the N-channel MOS transistor turns ON when the potential difference between the gate and the source of the N-channel MOS transistor T13 becomes beyond the threshold voltage of the N-channel MOS transistor T13.

The output signal S2 of the power detection circuit P is transmitted from the connection line between the N-channel MOS transistor T13 and the resistor R2. The output signal S2 bears the high level during the OFF state of the N-channel MOS transistor T13. The N-channel MOS transistor T9 shown in FIG. 2 is placed in the OFF state by the low level of the output signal S2.

In accordance with the power throw circuit P shown in FIG. 3, the power supply from the power source to the power utilizaton circuit C2 is automatically enabled upon the first application of power from the power source and even when the potential developed from the power source is reduced because of power consumption. That is, when the potential difference between the gate and the source of the N-channel MOS transistor T13 is below the threshold voltage of the N-channel MOS transistor T13 through the consumption of the power source, the N-channel MOS transistor T13 remains OFF to thereby retain the output signal S2 at the high level. Therefore, the power supply is enabled from the power source to the power utilization circuit C2 in accordance with the functions described above. The lapse of the life time of the power source is indicated by the display included within the power supply controller circuit C2, because the display can continuously provide an indication without regard to the actuation of any of the keys on the keyboard for generating the key signal S1.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A power supply controller for an apparatus including an input keyboard comprising:
    a power supply;
    switch means for selectively electrically interconnecting said power supply to said apparatus upon receipt of a control signal;
    power throw means for detecting an interconnection of said power supply to said switch means and producing a power supply enable output for a time period after said interconnection;
    power supply control means being operatively interconnected to said power throw means and said input keyboard for selectively controlling said switch means, said power supply control means generating said control signal upon generation of said power supply enable output and upon actuation of a key of said input keyboard for a predetermined time duration, said power supply control means including,
    flip-flop means, responsive to the application of a set signal thereto, for storing said set signal and applying it to said switch means as said control signal, said control signal being applied to said switch means only until the application of a reset signal to said flip-flop means, and
    OR gate means connected to said flip-flop means for receiving input signals from said input keyboard and said power supply enable output and producing a set signal for application to said flip-flop means in response to either a said input signal or said power supply enable output.

2. The controller of claim 1 wherein said power throw means comprises an MOS switching transistor and a condenser.

3. The controller of claim 1 wherein said switch means is a transistor.

* * * * *